(12) United States Patent
Yoon et al.

(10) Patent No.: US 11,415,631 B2
(45) Date of Patent: Aug. 16, 2022

(54) METHOD AND APPARATUS FOR ESTIMATING SOC-OCV PROFILE

(71) Applicant: LG CHEM, LTD., Seoul (KR)

(72) Inventors: Du-Seong Yoon, Daejeon (KR); Jin-Hyung Lim, Daejeon (KR); Yo-Han Ko, Daejeon (KR); Yong-Jun Kim, Daejeon (KR); Hyeong-Seok Kim, Daejeon (KR); Gi-Min Nam, Daejeon (KR); Se-Wook Seo, Daejeon (KR); Won-Tae Joe, Daejeon (KR); Su-Hyun Chae, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 222 days.

(21) Appl. No.: 16/624,057

(22) PCT Filed: Jan. 28, 2019

(86) PCT No.: PCT/KR2019/001182
§ 371 (c)(1),
(2) Date: Dec. 18, 2019

(87) PCT Pub. No.: WO2019/172527
PCT Pub. Date: Sep. 12, 2019

(65) Prior Publication Data
US 2020/0150183 A1 May 14, 2020

(30) Foreign Application Priority Data
Mar. 7, 2018 (KR) .................. 10-2018-0027135

(51) Int. Cl.
*G01R 31/367* (2019.01)
*G01R 31/382* (2019.01)
*G01R 31/392* (2019.01)

(52) U.S. Cl.
CPC ......... *G01R 31/367* (2019.01); *G01R 31/382* (2019.01); *G01R 31/392* (2019.01)

(58) Field of Classification Search
None
See application file for complete search history.

(56) References Cited

U.S. PATENT DOCUMENTS

| 10,371,753 B1* | 8/2019 | Wang | G01R 31/3648 |
| 2010/0291417 A1* | 11/2010 | Christensen | H01M 10/48 |
| | | | 429/50 |

(Continued)

FOREIGN PATENT DOCUMENTS

| CN | 104319425 A | 1/2015 |
| CN | 104656030 A | 5/2015 |

(Continued)

OTHER PUBLICATIONS

Extended European Search Report dated Nov. 12, 2020, issued in corresponding European Patent Application No. 19763308.4.

(Continued)

*Primary Examiner* — Brent A. Fairbanks
(74) *Attorney, Agent, or Firm* — Morgan, Lewis & Bockius LLP

(57) ABSTRACT

An apparatus estimating a state of charge (SOC)-open circuit voltage (OCV) profile, including: a storage unit storing: a beginning of life (BOL) positive electrode (PE) half-cell SOC-OCV profile and available range (AR), a BOL negative electrode (NE) half-cell SOC-OCV profile and AR, and a BOL full-cell SOC-OCV profile and total capacity (TC), and a control unit estimating a full-cell SOC-OCV profile at middle of life (MOL), including: an AR determination module for: calculating an MOL full-cell TC while a secondary battery is fully charged/discharged at MOL, and determining the MOL PE and NE ARs so a ratio of the MOL to the BOL full-cell TCs equals a ratio of the MOL to the (Continued)

BOL PE ARs and a ratio of the MOL to the BOL NE ARs, and a profile management module for: estimating, as an MOL full-cell SOC-OCV profile, a differential profile, and updating the BOL full-cell SOC-OCV profile.

14 Claims, 6 Drawing Sheets

(56) References Cited

U.S. PATENT DOCUMENTS

| | | | |
|---|---|---|---|
| 2012/0293131 A1 | 11/2012 | Nakamura et al. | |
| 2013/0162218 A1 | 6/2013 | Kang et al. | |
| 2016/0329738 A1 | 11/2016 | Shiraishi et al. | |
| 2017/0146610 A1* | 5/2017 | Cha | G01R 31/3835 |
| 2017/0170669 A1 | 6/2017 | Wang et al. | |
| 2017/0176541 A1 | 6/2017 | Shimizu | |
| 2017/0254856 A1 | 9/2017 | Shiraishi | |
| 2018/0284195 A1* | 10/2018 | K | H01M 10/052 |
| 2018/0313906 A1* | 11/2018 | Takahashi | G01R 31/3842 |
| 2019/0079136 A1 | 3/2019 | Lim et al. | |

FOREIGN PATENT DOCUMENTS

| | | | | |
|---|---|---|---|---|
| CN | 107144791 A | | 9/2017 | |
| JP | 2012-137330 A | | 7/2012 | |
| JP | 2012137330 | * | 7/2012 | ............ Y02E 60/12 |
| JP | 2013-181852 A | | 9/2013 | |
| JP | 2014-59206 A | | 4/2014 | |
| JP | 2016-186487 A | | 10/2016 | |
| JP | 2017-116518 A | | 6/2017 | |
| JP | 2017-167163 A | | 9/2017 | |
| KR | 10-2013-0017740 A | | 2/2013 | |
| KR | 10-2013-0136800 A | | 12/2013 | |
| KR | 10-1398465 B1 | | 5/2014 | |
| KR | 10-2016-0029054 A | | 3/2016 | |
| KR | 10-2016-0048585 A | | 5/2016 | |
| WO | 2018/038383 A1 | | 3/2018 | |

OTHER PUBLICATIONS

International Search Report issued in corresponding International Patent Application No. PCT/KR2019/001182, dated May 10, 2019.

* cited by examiner

METHOD AND APPARATUS FOR ESTIMATING SOC-OCV PROFILE

TECHNICAL FIELD

The present application claims priority to Korean Patent Application No. 10-2018-0027135 filed in the Republic of Korea on Mar. 7, 2018, the disclosure of which is incorporated herein by reference.

The present disclosure relates to a method for estimating a state of charge (SOC)-open circuit voltage (OCV) profile of a secondary battery, and more particularly, to a method and apparatus for estimating an SOC-OCV profile reflecting a degradation rate of a secondary battery based on a pre-stored half-cell SOC-OCV profile.

BACKGROUND ART

Secondary batteries generate electrical energy through electrochemical oxidation and reduction reactions, and are used in a wide range of applications. Batteries are gradually extending their application to, for example, portable devices such as mobile phones, laptop computers, digital cameras, video cameras, tablet computers and electric tools and various types of electricity powered devices such as e-bikes, electric motorcycles, electric vehicles and hybrid electric vehicles.

A battery includes three basic elements: a negative electrode (anode) including a material that is oxidized by emitting electrons during discharging; a positive electrode (cathode) including a material that is reduced by accepting electrons during discharging; and an electrolyte that allows ions to move between the negative electrode and the positive electrode. Batteries may be classified into primary batteries that cannot be re-used after discharged, and secondary batteries that can be recharged repeatedly.

A system including a secondary battery includes a management apparatus coupled with the secondary battery, and the management apparatus generally has a function of indicating a remaining available amount through the state of charge (SOC) of the secondary battery. The management apparatus stores an SOC-OCV profile representing a relationship between Open Circuit Voltage (OCV) and SOC, and determines the SOC corresponding to the currently measured or estimated OCV of the secondary battery from the SOC-OCV profile.

The SOC-OCV profile is generated by experimental measurements and stored in a memory device provided in the management apparatus. That is, with the repetition of charging and discharging of the secondary battery several times, SOC data at the measuring each OCV is collected, and an SOC-OCV profile representing a correlation between OCV and SOC is generated based on the collected data and stored in the memory device.

However, as the secondary battery degrades, it is necessary to measure the OCV and SOC of the secondary battery again and generate a new SOC-OCV profile reflecting the degradation rate based on the measured data. However, it takes much time to generate a new SOC-OCV profile, and it is not easy to update the new SOC-OCV profile.

DISCLOSURE

Technical Problem

The present disclosure is designed to solve the above-described conventional problem, and therefore the present disclosure is directed to providing a method and apparatus for estimating a state of charge (SOC)-open circuit voltage (OCV) profile in which an SOC-OCV profile applied during degradation is estimated in a short time, and the existing SOC-OCV profile is updated to the estimated SOC-OCV profile.

Technical Solution

To solve the above-described problem, an apparatus for estimating a state of charge (SOC)-open circuit voltage (OCV) profile according to the present disclosure includes a storage unit which stores a beginning of life (BOL) positive electrode half-cell SOC-OCV profile, a BOL positive electrode available range, a BOL negative electrode half-cell SOC-OCV profile, a BOL negative electrode available range, a BOL full-cell SOC-OCV profile and a BOL full-cell total capacity and a control unit which estimates a full-cell SOC-OCV profile at middle of life (MOL), wherein the control unit includes an available range determination module configured to calculate an MOL full-cell total capacity while a secondary battery is fully charged or fully discharged between a lower limit of discharge voltage and an upper limit of charge voltage when the secondary battery is at MOL, and determine the MOL positive electrode available range and the MOL negative electrode available range such that a ratio of the MOL full-cell total capacity to the BOL full-cell total capacity is equal to each of a ratio of the MOL positive electrode available range to the BOL positive electrode available range and a ratio of the MOL negative electrode available range to the BOL negative electrode available range, and a profile management module configured to estimate, as an MOL full-cell SOC-OCV profile, a differential profile corresponding to a difference between a positive electrode half-cell SOC-OCV profile part corresponding to the MOL positive electrode available range and a negative electrode half-cell SOC-OCV profile part corresponding to the MOL negative electrode available range, and update the BOL full-cell SOC-OCV profile stored in the storage unit to the estimated MOL full-cell SOC-OCV profile.

The available range determination module may be configured to determine, as reference values, a maximum allowable SOC value of the MOL positive electrode available range and a minimum allowable SOC value of the MOL negative electrode available range on the basis of the BOL positive electrode available range and the BOL negative electrode available range, and determine the MOL positive electrode available range and the MOL negative electrode available range by calculating a minimum allowable SOC value $p_i$ in the BOL positive electrode half-cell SOC-OCV profile and a maximum allowable SOC value of $n_f$ in the BOL negative electrode half-cell SOC-OCV profile using the following Equation.

$$p_i = p_{f,0} - \frac{(p_{f,0} - p_{i,0})Q_f}{Q_{f,0}}$$

$$n_f = n_{i,0} + \frac{(n_{f,0} - n_{i,0})Q_f}{Q_{f,0}}$$

The available range determination module may be configured to calculate an integrated current amount by accumulating and integrating a current of a secondary battery while the secondary battery is fully charged or fully discharged between the lower limit of discharge voltage and the upper limit of charge voltage, and determine the calculated integrated current amount as the MOL full-cell total capacity.

The profile management module may be configured to shift the BOL positive electrode half-cell SOC-OCV profile and the BOL negative electrode half-cell SOC-OCV profile relative to each other so that a difference between the BOL positive electrode half-cell SOC-OCV profile and the BOL negative electrode half-cell SOC-OCV profile is closest to the BOL full-cell SOC-OCV profile, and determine a differential profile of the two profiles shifted relative to each other as the BOL full-cell SOC-OCV profile.

The secondary battery may be a lithium secondary battery including a Ni—Mn—Co based positive electrode material in a positive electrode and graphite in a negative electrode.

To solve the above-described problem, a method for estimating an SOC-OCV profile reflecting a degradation rate of a secondary battery according to the present disclosure includes storing a BOL positive electrode half-cell SOC-OCV profile, a BOL positive electrode available range, a BOL negative electrode half-cell SOC-OCV profile, a BOL negative electrode available range, a BOL full-cell SOC-OCV profile and a BOL full-cell total capacity, calculating a MOL full-cell total capacity while the secondary battery is fully charged or fully discharged between a lower limit of discharge voltage and an upper limit of charge voltage when the secondary battery is at MOL, determining the MOL positive electrode available range and the MOL negative electrode available range such that a ratio of the MOL full-cell total capacity to the BOL full-cell total capacity is equal to each of a ratio of the MOL positive electrode available range to the BOL positive electrode available range and a ratio of the MOL negative electrode available range to the BOL negative electrode available range, estimating, as an MOL full-cell SOC-OCV profile, a differential profile corresponding to a difference between a positive electrode half-cell SOC-OCV profile part corresponding to the determined MOL positive electrode available range and a negative electrode half-cell SOC-OCV profile part corresponding to the determined MOL negative electrode available range, and updating a previously stored BOL full-cell SOC-OCV profile to the estimated MOL full-cell SOC-OCV profile.

Advantageous Effects

According to the present disclosure, a full-cell state of charge (SOC)-open circuit voltage (OCV) profile reflecting the degradation rate is estimated based on the pre-stored positive electrode half-cell SOC-OCV profile and negative electrode half-cell SOC-OCV profile, and the existing profile is updated to the estimated full-cell SOC-OCV profile, thereby updating the SOC-OCV profile quickly.

In addition, according to the present disclosure, an SOC-OCV profile is not generated by long-time experiments, and instead, an SOC-OCV profile is generated based on pre-stored data (i.e., half-cell SOC-OCV profile) and measured data (i.e., full-cell total capacity), thereby reducing the time required to generate the SOC-OCV profile.

MODE FOR DISCLOSURE

Figure 1:
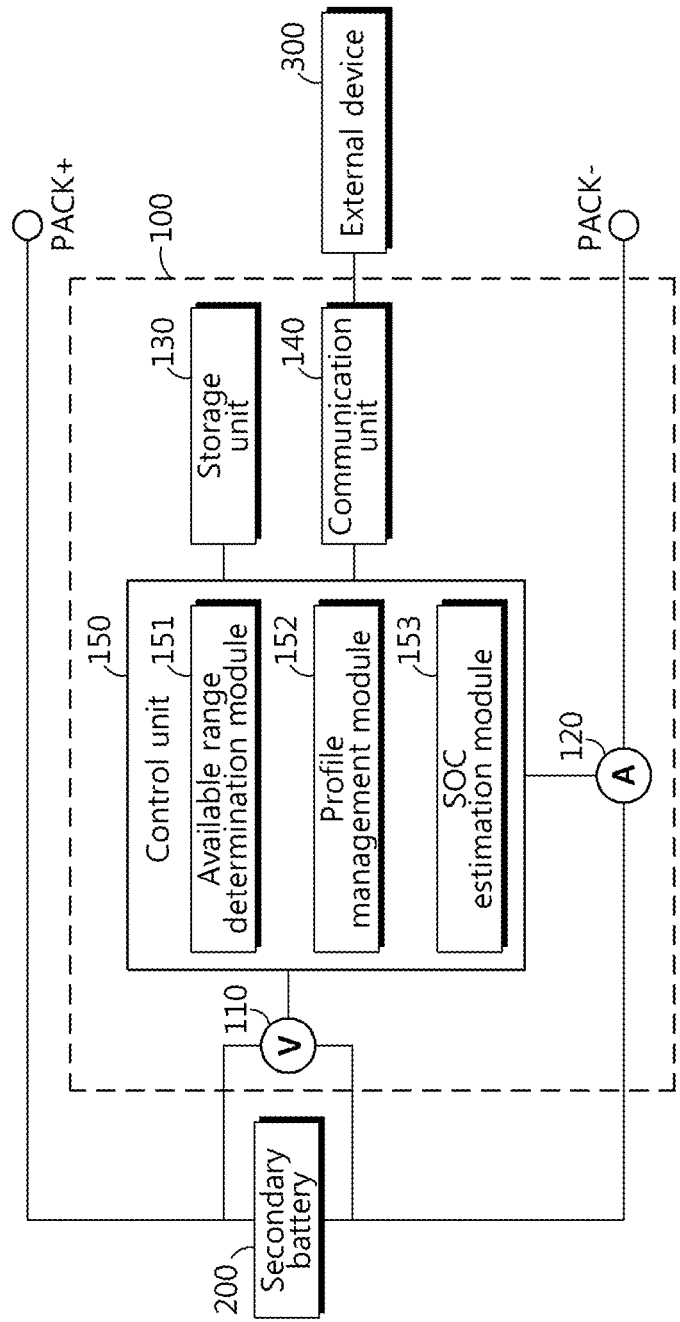
FIG. 1 is a schematic block diagram showing an apparatus for estimating a state of charge (SOC)-open circuit voltage (OCV) profile according to an embodiment of the present disclosure.

Hereinafter, the embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the embodiments described herein and illustrations shown in the drawings are just an embodiment of the present disclosure, but not intended to fully describe the technical aspects of the present disclosure, so it should be understood that other equivalents and modifications could be made thereto at the time of making the invention.

In the embodiment described below, a secondary battery refers to a lithium secondary battery. Here, the lithium secondary battery refers collectively to secondary batteries in which lithium ions act as working ions during charging and discharging, causing electrochemical reactions at the positive electrode and the negative electrode.

Meanwhile, even though the name of the secondary battery changes depending on the type of electrolyte or separator used in the lithium secondary battery, the type of packaging used to package the secondary battery and the internal or external structure of the lithium secondary battery, the lithium secondary battery should be interpreted as encompassing any secondary battery using lithium ions as working ions.

The present disclosure may be also applied to secondary batteries other than the lithium secondary battery. Accordingly, it should be interpreted that the present disclosure covers any type of secondary battery to which the technical aspects of the present disclosure may be applied, though working ions are not lithium ions.

Additionally, the secondary battery is not limited to the number of components. Accordingly, the secondary battery should be interpreted as including a single cell including an assembly of positive electrode/separator/negative electrode and an electrolyte in a packaging material as well as an assembly of cells, a module including assemblies connected in series and/or in parallel, a pack including modules connected in series and/or in parallel, and a battery system including packs connected in series and/or in parallel.

FIG. 1 is a schematic block diagram showing an apparatus for estimating a state of charge (SOC)-open circuit voltage (OCV) profile according to an embodiment of the present disclosure.

Referring to FIG. 1, the apparatus 100 for estimating an SOC-OCV profile according to an embodiment of the present disclosure is an apparatus that estimates and updates an SOC-OCV profile as a secondary battery 200 degrades, and includes a voltage measuring unit 110, a current measuring unit 120, a storage unit 130, and optionally, a communication unit 140 and a control unit 150.

The voltage measuring unit 110 includes a known voltage measurement circuit (for example, a differential amplifier), and periodically measures the voltage of the secondary battery 200 at a preset time interval, and transmits the measured voltage value to the control unit 150.

The current measuring unit 120 includes a sense resistor or a hall sensor, and periodically measures the current of the secondary battery 200 at a preset time interval, and transmits the measured current value to the control unit 150.

The storage unit 130 is a storage medium capable of recording and erasing data electrically, magnetically, optically or quantum-mechanically, and may include at least one of RAM, ROM, EPROM, flash memory, register and a disk device. The storage unit 130 may be connected to the control unit 150 via a data bus to allow the control unit 150 to access it.

The storage unit 130 may store programs including various control logics that are executed by the control unit 150, predefined parameters and/or data created when the control logics are executed, and may update or erase the programs or data. The storage unit 130 may be split into two or more logically or physically, and may be integrated with the control unit 150.

Preferably, the storage unit 130 stores a BOL positive electrode half-cell SOC-OCV profile, a BOL negative electrode half-cell SOC-OCV profile and a BOL full-cell SOC-OCV profile. The BOL positive electrode half-cell SOC-OCV profile is pre-recorded in the storage unit 130 as data (for example, a lookup table or a function) indicating a relationship between OCV and SOC measured in the positive electrode half-cell through the experiment at the point of sale of the secondary battery 200 (i.e., Beginning Of Life, hereinafter referred to as 'BOL') before the secondary battery degrades. The BOL negative electrode half-cell SOC-OCV profile is pre-recorded in the storage unit 130 as data (for example, a lookup table or a function) indicating a relationship between OCV and SOC measured in the negative electrode half-cell through the experiment when the secondary battery is at BOL. The SOC has a value between 0 and 1, and 1 indicates that the half-cell is charged up to the maximum (i.e., 100%) of the available range.

In the present disclosure, the positive electrode half-cell refers to a battery manufactured using the positive electrode that constitutes the full-cell and a lithium metal for its positive electrode and negative electrode, respectively. Additionally, the negative electrode half-cell refers to a battery manufactured using the negative electrode that constitutes the full-cell and a lithium metal for its positive electrode and negative electrode, respectively. The positive electrode half-cell and the negative electrode half-cell have substantially the same battery structure and electrolyte, only different in the electrode type, when compared with the full-cell.

The storage unit 130 may pre-record a full-cell SOC-OCV profile. The full-cell SOC-OCV profile is data (for example, a lookup table or a function) indicating a relationship between OCV and SOC when the secondary battery 200 is at BOL or in use (i.e., at Middle Of Life, hereinafter referred to as 'MOL'). The SOC value ranges between 0 and 1, and 1 indicates that the full-cell is charged to the maximum (i.e., 100%) of the available range.

The storage unit 130 may store an integrated current value corresponding to the total capacity of the full-cell at BOL (BOL full-cell total capacity). The integrated current value corresponding to the BOL full-cell total capacity is a value obtained by accumulating and integrating the current of the secondary battery 200 while the secondary battery 200 is fully charged or fully discharged between the lower limit of discharge voltage and the upper limit of charge voltage, and may be pre-measured through experiments and pre-stored in the storage unit 130.

The BOL positive electrode half-cell SOC-OCV profile and the BOL negative electrode half-cell SOC-OCV profile are generated through the charge/discharge experiment and pre-stored in the storage unit 130. The full-cell SOC-OCV profile at BOL is also generated through the charge/discharge experiment and pre-stored in the storage unit 130, and when the secondary battery 200 degrades (i.e., when the secondary battery is at MOL), it is changed or updated to a new full-cell SOC-OCV profile generated by the control unit 150.

The communication unit 140 is a component that may be optionally provided in the apparatus 100, and performs a communication function with an external device 300. The communication unit 140 may communicate with the external device 300 via Controller Area Network (CAN) communication, or using other known wired or wireless communication protocol.

When the secondary battery 200 is mounted in an electric vehicle or a hybrid electric vehicle, the external device 300 may be an Electronic Control Unit (ECU) responsible for controlling the electrical component of the vehicle.

The communication unit 140 may transmit the full-cell SOC-OCV profile stored in the storage unit 130 to the external device 300 under the control of the control unit 150.

The control unit 150 includes a processor, and controls the entire function of the apparatus 100 for estimating an SOC-OCV profile. The control unit 150 estimates an MOL full-cell SOC-OCV profile of the secondary battery reflecting the degradation rate according to the logic as described below, and changes or updates the existing BOL full-cell SOC-OCV profile stored in the storage unit 130 to the estimated MOL full-cell SOC-OCV profile. Preferably, the control unit 150 re-estimates a full-cell SOC-OCV profile in a predetermined cycle, and periodically updates the existing MOL full-cell SOC-OCV profile stored in the storage unit 130.

The control unit 150 may access the communication unit 140 via a data bus, and the control unit 150 and the communication unit 140 may be integrated into a single board. The control unit 150 may measure the OCV through the voltage measuring unit 110 before the secondary battery 200 is charged and discharged, and determine the state of charge (i.e., SOC) of the secondary battery corresponding to the measured OCV using the full-cell SOC-OCV profile recorded in the storage unit 130. For example, the SOC-OCV profile may be a lookup table, and the control unit 150 may determine an SOC value by mapping the SOC corresponding to the OCV from the lookup table.

According to embodiments, the control unit 150 may transmit the SOC of the secondary battery 200 determined using the updated full-cell SOC-OCV profile stored in the storage unit 130 to the external device 300 through the communication unit 140. The external device 300 may be a controller of a load device that is supplied with electrical energy from the secondary battery 200, such as the ECU, but the present disclosure is not limited thereto.

The control unit 150 includes an available range determination module 151, a profile management module 152 and an SOC estimation module 153. In an example, the available range determination module 151, the profile management module 152 and the SOC estimation module 153 may be a program module that is operated by the processor. In another example, the available range determination module 151, the profile management module 152 and the SOC estimation module 153 may be an integrated circuit chipset developed to execute the control logic as described below, for example, an ASIC chipset.

When the secondary battery 200 enters MOL, the available range determination module 151 determines an MOL positive electrode available range and an MOL negative electrode available range (see $p_f-p_i$, $n_f-n_i$ in FIG. 4) changed as described below in the BOL positive electrode half-cell SOC-OCV profile and the BOL negative electrode half-cell SOC-OCV profile, respectively. The profile management module 152 estimates a differential profile generated from a difference between BOL positive electrode SOC-OCV profile part corresponding to the determined MOL positive electrode available range and BOL negative electrode SOC-OCV profile part corresponding to the determined MOL negative electrode available range as an MOL full-cell SOC-OCV profile at MOL (i.e., reflecting the degradation rate), and changes or updates the existing BOL full-cell SOC-OCV profile stored in the storage unit 130 to the estimated MOL full-cell SOC-OCV profile.

Hereinafter, the control logic for estimating the MOL full-cell SOC-OCV profile by the control unit 150 will be described in more detail with reference to FIGS. 2 to 5.

Figure 2:
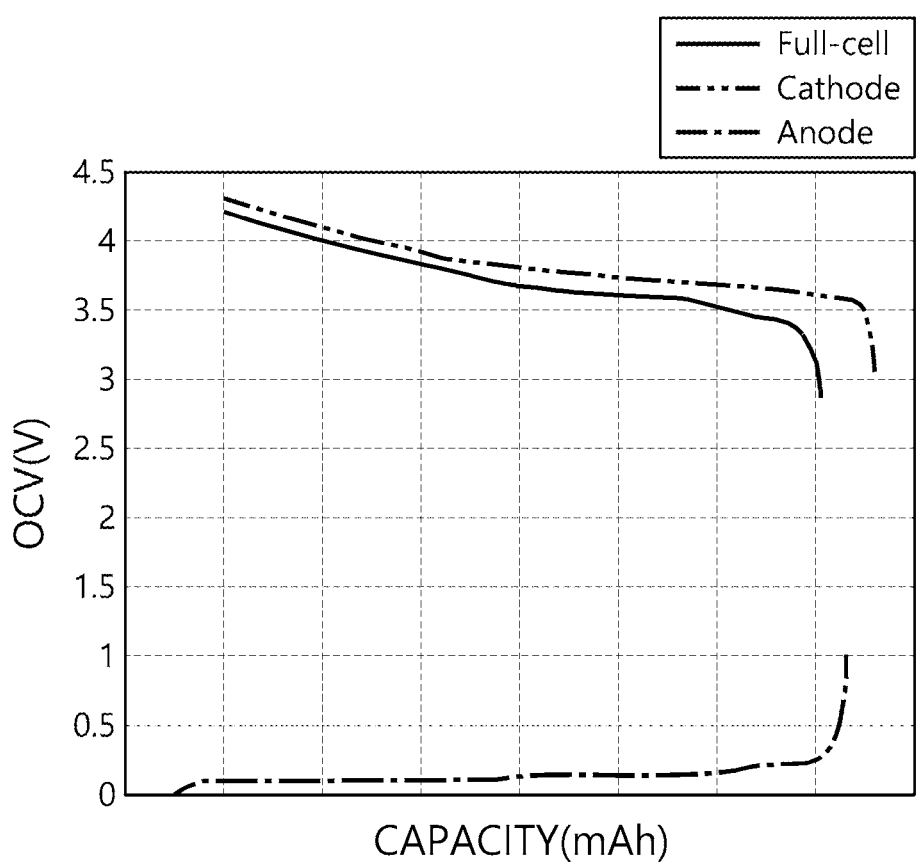
FIG. 2 is a diagram showing a beginning of life (BOL) full-cell SOC-OCV profile, a BOL positive electrode half-cell SOC-OCV profile and a BOL negative electrode half-cell SOC-OCV profile in the form of graph.

FIG. 2 is a diagram showing the BOL full-cell SOC-OCV profile, the BOL positive electrode half-cell SOC-OCV profile and the BOL negative electrode half-cell SOC-OCV profile in the form of graph.

Referring to FIG. 2, three profiles, namely, the BOL full-cell SOC-OCV profile, the BOL positive electrode half-cell SOC-OCV profile and the BOL negative electrode half-cell SOC-OCV profile are obtained through experiments and pre-stored in the storage unit 130.

In FIG. 2, Y axis indicates an OCV value, and the OCV value increases as it goes upwards. Additionally, X axis indicates capacity, and the capacity may be indicated in mAh, a unit of the integrated current amount over time. In each SOC-OCV profile, the left end point corresponds to 1 SOC, and the right end point corresponds to 0 SOC. The capacity on the X axis has the magnitude reducing from left to right.

In each SOC-OCV profile, the capacity of the left end point corresponds to an integrated current value obtained by accumulating and integrating the charge current while the fully discharged half-cell or full-cell is charged to the maximum extent. Additionally, in each SOC-OCV profile, the capacity of the right end point corresponds to a value obtained by subtracting an integrated current value obtained by accumulating and integrating the discharge current while the fully charged half-cell or full-cell is discharged to the lower limit of discharge voltage from the capacity of the left end point.

In an example, in the BOL positive electrode half-cell SOC-OCV profile, when the capacity of the left end point is 1000 mAh (corresponding to 1 SOC), and the integrated current value of the discharge current is 600 mAh while the positive electrode half-cell in fully charged state is discharged to the lower limit of discharge voltage, the capacity of the right end point may be 400 mAh (corresponding to 0 SOC).

In another example, in the BOL negative electrode half-cell SOC-OCV profile, when the capacity of the left end point is 1040 mAh (corresponding to 1 SOC), and the integrated current value of the discharge current is 590 mAh while the negative electrode half-cell in fully charged state is discharged to the lower limit of discharge voltage, the capacity of the right end point may be 450 mAh (corresponding to 0 SOC).

In still another example, in the BOL full-cell SOC-OCV profile, when the capacity of the left end point is 1000 mAh (corresponding to 1 SOC), and the integrated current value of the discharge current is 500 mAh while the full-cell in fully charged state is discharged to the lower limit of discharge voltage, the capacity of the right end point may be 500 mAh (corresponding to 0 SOC).

According to the present disclosure, the positive electrode half-cell SOC-OCV profile and/or the negative electrode half-cell SOC-OCV profile may be pre-processed by shift in the X axis direction so that a difference between the positive electrode half-cell SOC-OCV profile and the negative electrode half-cell SOC-OCV profile is closest to the full-cell SOC-OCV profile.

In addition, at least one of the BOL negative electrode half-cell SOC-OCV profile and the BOL positive electrode half-cell SOC-OCV profile may be shifted to the left or right so that a differential profile generated from a difference between the BOL positive electrode half-cell SOC-OCV profile and the BOL negative electrode half-cell SOC-OCV profile is most similar to the BOL full-cell SOC-OCV profile.

The pre-processing (i.e., shift) for the BOL positive electrode/negative electrode half-cell SOC-OCV profile may be performed by the profile management module 152 of the control unit 150.

Figure 3:
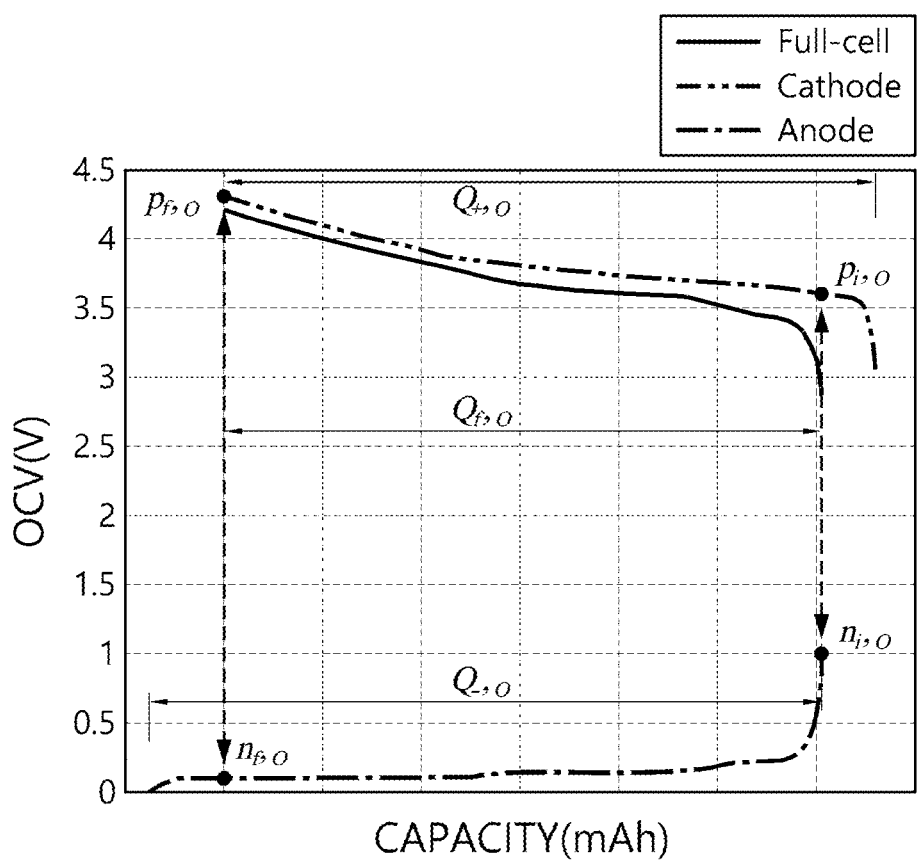
FIG. 3 is a diagram showing pre-processed BOL positive electrode half-cell SOC-OCV profile and BOL negative electrode half-cell SOC-OCV profile and a BOL full-cell SOC-OCV profile in the form of graph.

FIG. 3 is an exemplary diagram showing the pre-processed BOL positive electrode half-cell SOC-OCV profile and BOL negative electrode half-cell SOC-OCV profile and the BOL full-cell SOC-OCV profile in the form of graph.

The graph showing the BOL negative electrode half-cell SOC-OCV profile according to FIG. 3 is pre-processed by shift to the left when compared with FIG. 2. Additionally, in FIG. 3, $Q_{+,0}$ denotes the pre-processed BOL positive electrode half-cell total capacity, and $Q_{-,0}$ denotes the pre-processed BOL negative electrode half-cell total capacity. The total capacity corresponds to a difference between capacity values corresponding to the left end point and the right end point in the profile of the half-cell. In the BOL profile, the results of $(p_{f,0}-p_{i,0}) \times Q_{+,0}$ and $(n_{f,0}-n_{i,0}) \times Q_{-,0}$ are the same. The values p and n represent coordinate values on a Cartesian plane, e.g., as shown in the example of FIG. 3.

In the pre-processed BOL positive electrode half-cell SOC-OCV profile, the available range determination module 151 may determine an SOC value corresponding to the leftmost point of the BOL full-cell SOC-OCV profile as a maximum allowable SOC value $p_{f,0}$, and an SOC value corresponding to the rightmost point of the BOL full-cell SOC-OCV profile as a minimum allowable SOC value $p_{i,0}$.

Likewise, in the BOL negative electrode half-cell SOC-OCV profile, the available range determination module 151 may determine an SOC value corresponding to the leftmost point of the BOL full-cell SOC-OCV profile as a maximum allowable SOC value $n_{f,0}$, and an SOC value corresponding to the rightmost point of the BOL full-cell SOC-OCV profile as a minimum allowable SOC value $n_{i,0}$.

That is, $p_{i,0}$ and $p_{f,0}$ are SOC values of points that meet each other when the right end point and the left end point of the full-cell SOC-OCV profile are projected onto the positive electrode half-cell SOC-OCV profile, and $n_{i,0}$ and $n_{f,0}$ are SOC values of points that meet each other when the right end point and the left end point of the full-cell SOC-OCV profile are projected onto the negative electrode half-cell SOC-OCV profile.

The minimum allowable SOC values $p_{i,0}$, $n_{i,0}$ are capacity values indicating the lower discharge threshold, and for safety of the secondary battery, they are set higher than a theoretical maximum discharge threshold. That is, even in a situation in which the secondary battery reaches the minimum allowable SOC values $p_{i,0}$, $n_{i,0}$, it is substantially possible to discharge the secondary battery, but when the secondary battery is discharged to the theoretical maximum discharge threshold, the life and characteristics of the secondary battery degrade, and accordingly, for safety of the secondary battery, when the secondary battery is discharged to the voltage corresponding to the minimum allowable SOC values $p_{i,0}$, $n_{i,0}$, discharging is stopped.

Likewise, the maximum allowable SOC values $p_{f,0}$, $n_{f,0}$ is an SOC value indicating the upper charge threshold, and for safety of the secondary battery, it is set lower than a theoretical charge threshold. That is, even in a situation in which the secondary battery reaches the maximum allowable SOC values $p_{f,0}$, $n_{f,0}$, it is substantially possible to charge the secondary battery, but when the secondary battery is charged to the theoretical charge threshold, the life and characteristics of the secondary battery degrade, and accordingly, for safety of the secondary battery, when the secondary battery is charged to the voltage corresponding to the maximum allowable SOC values $p_{f,0}$, $n_{f,0}$, charging is stopped.

When the minimum allowable SOC values $p_{i,0}$, $n_{i,0}$ and the maximum allowable SOC values $p_{f,0}$, $n_{f,0}$ are determined, the available range determination module 151 determines BOL positive electrode available range in the BOL positive electrode half-cell SOC-OCV profile as the range of $p_{f,0} \sim p_{i,0}$, and sets BOL negative electrode available range in the BOL negative electrode half-cell SOC-OCV profile to the range of $n_{f,0} \sim n_{i,0}$.

Accordingly, the available range of the BOL positive electrode half-cell SOC-OCV profile and the BOL negative electrode half-cell SOC-OCV profile corresponding to the BOL full-cell SOC-OCV profile when the secondary battery 200 is at BOL is determined as the range of the minimum allowable SOC values $p_{i,0}$, $n_{i,0} \sim$ the maximum allowable SOC value values $p_{f,0}$, $n_{f,0}$.

When the BOL positive electrode available range and the BOL negative electrode available range are determined, the profile management module 152 determines BOL full-cell capacity $Q_{f,0}$. The full-cell capacity $Q_{f,0}$ corresponds to a difference between two capacity values corresponding to the left end point and the right end point of the BOL full-cell SOC-OCV profile. In the BOL full-cell SOC-OCV profile, the SOC value of the left end point corresponding to the maximum allowable SOC values $p_{f,0}$, $n_{f,0}$ is set as a maximum SOC value, and the SOC value of the right end point corresponding to the minimum allowable SOC values $p_{i,0}$, $n_{i,0}$ is set as a minimum SOC value.

When the maximum SOC value and the minimum SOC value are set in the capacity range of the full-cell, while the full-cell is charged or discharged at BOL, the SOC estimation module 153 may accumulate and integrate the current amount measured by the current measuring unit 120, and determine an SOC value at the current time using a relative ratio of the integrated current amount on the basis of the full-cell capacity $Q_{f,0}$.

Preferably, the BOL full-cell SOC-OCV profile may be used until the number of charge/discharge cycles of the secondary battery 200 reaches a preset value.

Figure 4:
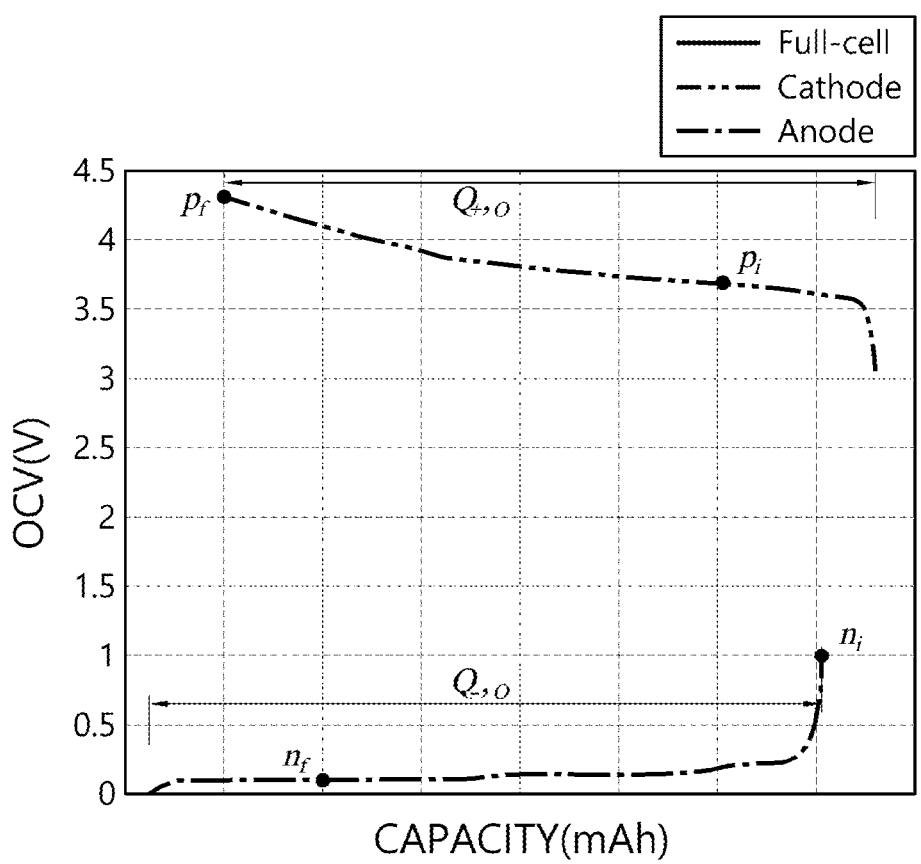
FIG. 4 is a diagram showing an MOL positive electrode available range and an MOL negative electrode available range changed in a BOL positive electrode half-cell SOC-OCV profile and a BOL negative electrode half-cell SOC-OCV profile when a secondary battery goes into a middle of life (MOL) as the secondary battery degrades in a larger number of charge/discharge cycles than a preset value.

FIG. 4 is an exemplary diagram showing a changed MOL positive electrode available range and a changed MOL negative electrode available range in the BOL positive electrode half-cell SOC-OCV profile and the BOL negative electrode half-cell SOC-OCV profile when the secondary battery enters MOL as the secondary battery degrades in a larger number of charge/discharge cycles than the preset value.

Figure 5:
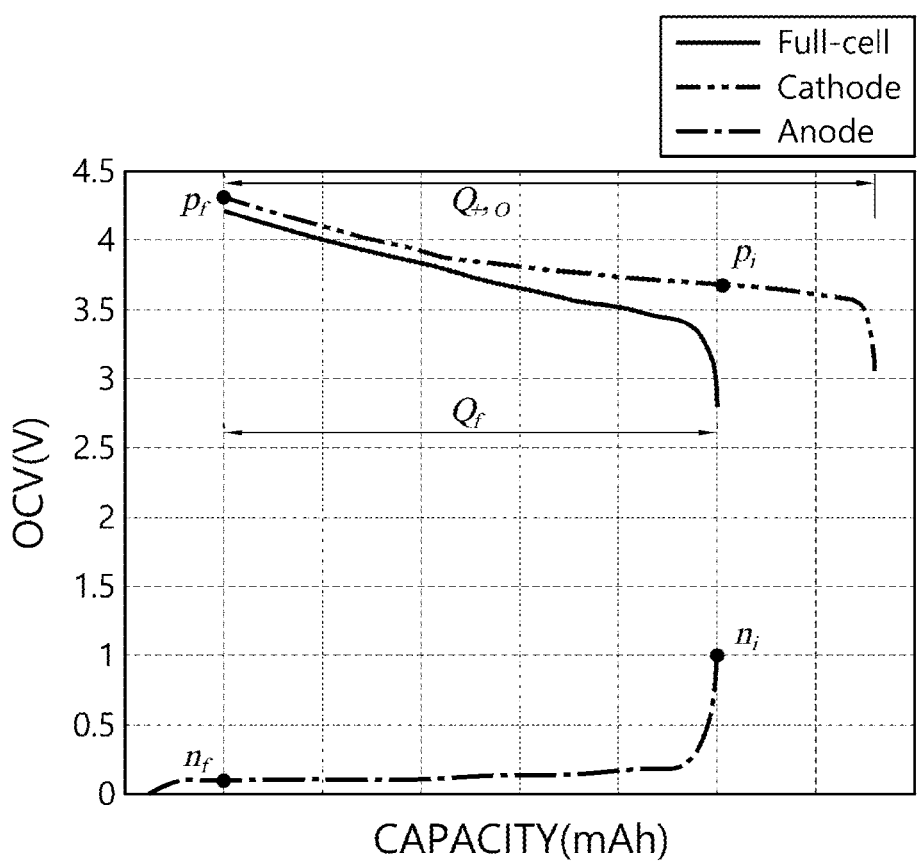
FIG. 5 is a diagram showing an MOL full-cell SOC-OCV profile in the form of graph.

FIG. 5 is a diagram showing the MOL full-cell SOC-OCV profile in the form of graph.

Referring to FIGS. 4 and 5, when the secondary battery enters MOL as the secondary battery degrades, the available range determination module 151 periodically measures the voltage and the current of the secondary battery 200 using the voltage measuring unit 110 and the current measuring unit 120 while the secondary battery 200 is fully charged or fully discharged between the lower limit of discharge voltage and the upper limit of charge voltage, and records data associated with the measured voltage and current in the storage unit 130.

Additionally, the available range determination module 151 determines an integrated current value by integrating the current measured repeatedly during full charge or full discharge between the lower limit of discharge voltage and the upper limit of charge voltage.

Here, the integrated current value corresponds to the MOL full-cell total capacity $Q_f$ of the secondary battery 200 at MOL. The MOL full-cell total capacity $Q_f$ may be determined by any method known in the art other than the method described herein.

The available range determination module 151 determines a changed MOL positive electrode available range and a changed MOL negative electrode available range $p_f \sim p_i$, $n_f \sim n_i$ in the BOL positive electrode half-cell SOC-OCV profile and the BOL negative electrode half-cell SOC-OCV profile of the secondary battery 200 at MOL, respectively, based on the calculated MOL full-cell total capacity $Q_f$. In this instance, the available range determination module 151 determines MOL positive electrode available range and MOL negative electrode available range $p_f \sim p_i$, $n_f \sim n_i$ in the BOL positive electrode half-cell SOC-OCV profile and the BOL negative electrode half-cell SOC-OCV profile, respectively, such that a ratio of the MOL full-cell total capacity $Q_f$ to the BOL full-cell total capacity $Q_{f,0}$ is equal to a ratio of the MOL positive electrode available range $p_f \sim p_i$ to the BOL positive electrode available range $p_{f,0} \sim p_{i,0}$ and a ratio of MOL negative electrode available range $n_f \sim n_i$ to the BOL negative electrode available range $n_{f,0} \sim n_{i,0}$.

To determine the MOL positive electrode available range and the MOL negative electrode available range, it is necessary to determine the start point and the end point (i.e., the maximum allowable SOC value and the minimum allowable SOC value) of the available range, and logic for determining the start point and the end point of the available range is as below.

The present disclosure assumes that although the secondary battery 200 degrades, the BOL positive electrode half-cell SOC-OCV profile and the BOL negative electrode half-cell SOC-OCV profile do not change in shape. That is, assume that there is no change in a difference value of capacities corresponding to the left end point and the right end point of the BOL positive electrode half-cell SOC-OCV profile and a difference value of capacities corresponding to the left end point and the right end point of the BOL negative electrode half-cell SOC-OCV profile. Additionally, the present disclosure assumes that there is no change in the maximum allowable SOC value $p_{f,0}$ of the positive electrode half-cell at BOL and the minimum allowable SOC value $n_{i,0}$ of the negative electrode half-cell at BOL. This assumption may be applied to a lithium secondary battery including a Ni—Mn—Co based positive electrode material in the positive electrode and graphite in the negative electrode.

Additionally, the following relational expression may be derived through the above assumption.

$$Q_+ = Q_{+,0} Q_- = Q_{-,0}$$

$$Q_+ = Q_f/(p_f - p_i) Q_- = Q_f/(n_f - n_i)$$

$$p_f = p_{f,0} n_i = n_{i,0}$$

Here, $Q_+$ is the positive electrode half-cell total capacity at MOL, $Q_{+,0}$ is the positive electrode half-cell total capacity at BOL, $Q_-$ is the negative electrode half-cell total capacity at MOL, and $Q_{-,0}$ is the negative electrode half-cell total capacity at BOL. Additionally, $Q_f$ is the MOL full-cell total capacity, $p_f$ is the maximum allowable SOC value of the positive electrode half-cell at MOL, and $p_i$ is the minimum allowable SOC value (a value between 0 and 1) of the positive electrode half-cell at MOL. $n_f$ of is the maximum allowable SOC value (a value between 0 and 1) of the negative electrode half-cell at MOL, and $n_i$ is the minimum allowable SOC value of the negative electrode half-cell at MOL. Additionally, $p_{f,0}$ is the maximum allowable SOC value of the positive electrode half-cell at BOL, and $n_{i,0}$ is the minimum allowable SOC value of the negative electrode half-cell at BOL.

Additionally, the condition in which a ratio of the MOL full-cell total capacity $Q_f$ to the BOL full-cell total capacity $Q_{f,0}$ is equal to a ratio of the available range $p_f \sim p_i$, $n_f \sim n_i$ at MOL to the available range $p_{f,0} \sim p_{i,0}$, $n_{f,0} \sim n_{i,0}$ determined at BOL may be expressed as Equation 1.

$$Q_{f,0} : Q_f = (p_{f,0} - p_{i,0}) : (p_f - p_i)$$

$$Q_{f,0} : Q_f = (n_{f,0} - n_{i,0}) : (n_f - n_i) \quad \text{[Equation 1]}$$

A mathematical expression for finding $p_i$ and $n_f$ using the above relational expression and the above Equation 1 is written as the following Equation 2.

$$p_i = p_{f,0} - \frac{(p_{f,0} - p_{i,0}) Q_f}{Q_{f,0}} \quad \text{[Equation 2]}$$

$$n_f = n_{i,0} + \frac{(n_{f,0} - n_{i,0}) Q_f}{Q_{f,0}}$$

Here, $p_i$ is the minimum allowable SOC value re-determined in the BOL positive electrode half-cell SOC-OCV profile (i.e., re-determined at MOL) as the secondary battery 200 degrades, and $n_f$ is the maximum allowable SOC value re-determined in the BOL negative electrode half-cell SOC-OCV profile (i.e., re-determined at MOL) as the secondary battery 200 degrades. Additionally, $p_f$ is the maximum allowable SOC value at MOL determined in the BOL positive electrode half-cell SOC-OCV profile, and it is preset based on the pre-processed BOL positive electrode half-cell SOC-OCV profile and has the same value as $p_{f,0}$. $n_i$ is the minimum allowable SOC value at MOL determined in the BOL negative electrode half-cell SOC-OCV profile, and it is preset based on the pre-processed BOL negative electrode half-cell SOC-OCV profile and has the same value as $n_{i,0}$. Additionally, $(p_f - p_i) \times Q_+$ and $(n_f - n_i) \times Q_-$ are equal.

Because each factor substituted into the right side of Equation 2 is known, the available range determination module 151 calculates $p_i$, $n_f$ in the positive electrode and negative electrode available ranges changed at MOL using the above Equation 2, and determines the positive electrode and negative electrode available ranges $p_f \sim p_i$ and $n_f \sim n_i$ changed at MOL, respectively, in the BOL positive electrode half-cell SOC-OCV profile and the BOL negative electrode half-cell SOC-OCV profile.

The profile management module 152 checks the ranges corresponding to the changed available ranges in each of the BOL half-cell SOC-OCV profile and the BOL positive electrode half-cell SOC-OCV profile, calculates a difference between the checked available range (hereinafter referred to as a 'positive electrode available range') of the positive electrode half-cell SOC-OCV profile and the checked available range (hereinafter referred to as a 'positive electrode available range') of the negative electrode half-cell SOC-OCV profile, and estimates an MOL full-cell SOC-OCV profile at MOL (see FIG. 5). In this instance, the available range determination module 151 may shift to the left or right, one of negative electrode half-cell SOC-OCV profile part corresponding to the negative electrode available range and positive electrode half-cell SOC-OCV profile part corresponding to the positive electrode available range to cause the capacity ranges (i.e., X-axis ranges) of the two available ranges to overlap, so that the minimum allowable SOC value $n_i$ of the negative electrode available range and the minimum allowable SOC value $p_i$ of the positive electrode available range are equal to each other. Additionally, the available range determination module 151 may calculate a profile corresponding to a difference between positive electrode half-cell SOC-OCV profile part corresponding to the changed positive electrode available range and negative electrode half-cell SOC-OCV profile part corresponding to the changed negative electrode available range, and generate the calculated profile as a full-cell SOC-OCV profile at MOL.

Referring to FIG. 5, it can be seen that the MOL full-cell SOC-OCV profile shows lower total capacity (i.e., the horizontal length of the graph) than the BOL full-cell SOC-OCV profile. Additionally, in FIG. 5, the negative electrode half-cell SOC-OCV profile part corresponding to the negative electrode available range is shifted to the left so that the minimum allowable SOC value $n_i$ of the negative electrode available range and the minimum allowable SOC value $p_i$ of the positive electrode available range are equal to each other.

As the secondary battery 200 degrades, the MOL full-cell SOC-OCV profile reflecting the reduced capacity may be generated and updated by the profile management module 152.

The profile management module 152 may check the total capacity range of the full-cell in the estimated MOL full-cell SOC-OCV profile, and re-set the maximum allowable SOC value corresponding to the leftmost point to '1' and the minimum allowable SOC value corresponding to the rightmost point to '0'. Additionally, the profile management module 152 updates the existing full-cell SOC-OCV profile stored in the storage unit 130 the generated MOL full-cell SOC-OCV profile. For example, when the existing full-cell SOC-OCV profile is recorded in the storage unit 130 in the form of a lookup table, the profile management module 152 re-sets the SOC value corresponding to each OCV using coordinate data that forms the generated SOC-OCV profile.

When the full-cell SOC-OCV profile stored in the storage unit 130 is updated as described above, the SOC estimation module 153 of the control unit 150 may estimate the SOC of the secondary battery 200 using the updated full-cell SOC-OCV profile while the secondary battery is fully discharged.

In detail, the SOC estimation module 153 measures the OCV of the secondary battery 200 using the voltage measuring unit 110 before charging/discharging of the secondary battery 200 starts, and determines an SOC value corresponding to the measured OCV from the updated SOC-OCV profile (lookup table mapping) stored in the storage unit 130. Subsequently, the SOC estimation module 153 may calculate an integrated current amount by integrating the current during charging/discharging of the secondary battery 200, calculate a variation of SOC by a ratio of the integrated current amount to the full-cell total capacity $Q_f$, and estimate a relative ratio of the remaining capacity to the total capacity of the secondary battery 200 by adding the calculated variation of SOC to the SOC value determined from the OCV, namely, a current SOC value.

The SOC estimation module 153 may record the estimated current SOC value in the storage unit 130, or transmit it to the external device 300 through the communication unit 140. The external device 300 may control the charging and discharging of the secondary battery 200 properly by referring to the transmitted current SOC value. For example, when the current SOC value reaches 1, the external device 300 interrupts charging, and on the contrary, when the current SOC value reaches 0, the external device 300 interrupts discharging. The interruption of charging and discharging may be implemented by turning off the switch installed on the line through which the charge current or the discharge current flows.

Meanwhile, the control unit 150 may selectively include a processor, an Application-Specific Integrated Circuit (ASIC), a chipset, a logic circuit, a register, a communication modem and a data processing device known in the art to execute various control logics disclosed herein.

Additionally, when the control logics are implemented in software, the available range determination module 151, the profile management module 152 and the SOC estimation module 153 included in the control unit 150 may be implemented in the form of program. In this instance, each module may be stored in the storage unit 130 in the form of programs and instruction sets that are executed by the processor.

Figure 6:
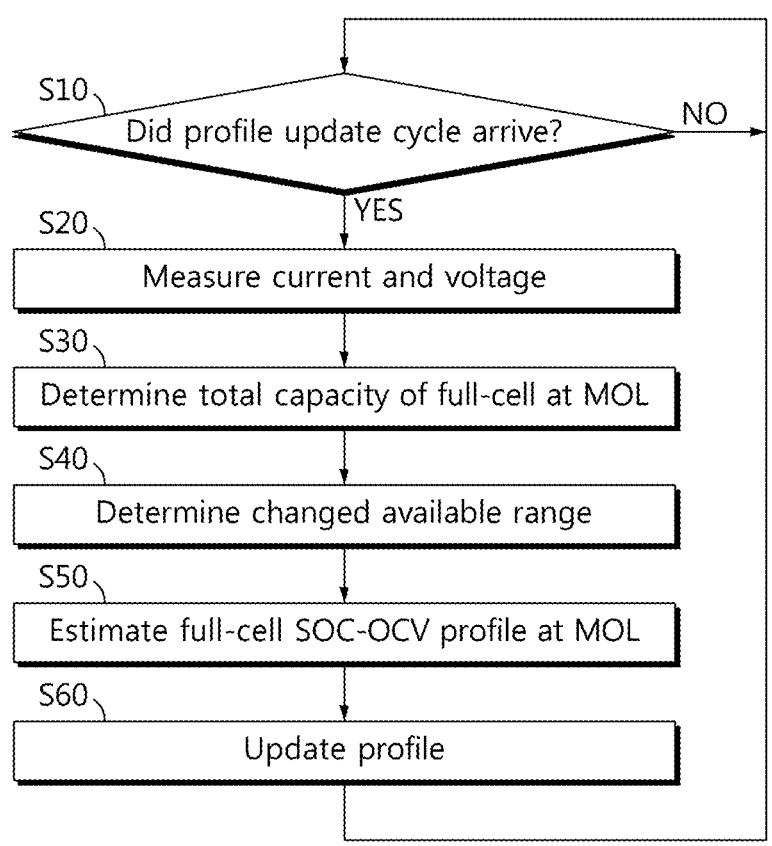
FIG. 6 is a flowchart illustrating a method for estimating an SOC-OCV profile according to an embodiment of the present disclosure.

FIG. 6 is a flowchart illustrating a method for estimating an SOC-OCV profile according to an embodiment of the present disclosure.

Referring to FIG. 6, the available range determination module 151 monitors if a preset profile update cycle arrives (S10). The profile update cycle may be preset based on the number of times the secondary battery was used (the number of charge and discharge cycles) and the period during which the secondary battery was used, and stored in the storage unit 130. The information about how many times the secondary battery was used or how long the secondary battery has been used is recorded in the storage unit 130 and will be referred to. Although not shown in the drawings, the control unit 150 may further include a module to count the number of times the secondary battery was used (when charging and discharging form a cycle, the number of repetitions of the cycle) and record it in the storage unit 130, or a module to count the period during which the secondary battery was used (the period during which the charge time and the discharge time are accumulated) and record it in the storage unit 130. The arrival of the update cycle indicates that the secondary battery 200 enters MOL from BOL.

Subsequently, when the profile update cycle arrives, the available range determination module 151 repeatedly measures the voltage and current of the secondary battery 200 using the voltage measuring unit 110 and the current measuring unit 120 while the secondary battery 200 is fully charged or fully discharged, and stores the measured voltage and current data in the storage unit 130 (S20). Here, the full charge refers to charging of the secondary battery 200 from the lower limit of discharge voltage to the upper limit of charge voltage, and the full discharge refers to discharging of the secondary battery 200 from the upper limit of charge voltage to the lower limit of discharge voltage.

Subsequently, the available range determination module 151 determines MOL full-cell total capacity $Q_f$ of the secondary battery 200 at MOL by integrating the current of the secondary battery 200 while the secondary battery 200 is fully discharged or fully charged (S30).

Subsequently, the available range determination module 151 determines the positive electrode and negative electrode available ranges $p_f \sim p_i$, $n_f \sim n_i$ changed at MOL in the BOL positive electrode half-cell SOC-OCV profile and the BOL negative electrode half-cell SOC-OCV profile, respectively, such that a ratio of the full-cell total capacity $Q_f$ at MOL to the full-cell total capacity $Q_{f,0}$ at BOL is equal to a ratio of the available range $p_f \sim p_i$, $n_f \sim n_i$ at MOL to the available range $p_{f,0} \sim p_{i,0}$, $n_{f,0} \sim n_{i,0}$ determined at BOL (S40). In this instance, the available range determination module 151 calculates the unknown $p_i$, $n_f$ by substituting the known factors $p_{f,0}$, $p_{i,0}$, $Q_f$, $Q_{f,0}$, $n_{i,0}$, $n_{f,0}$ into the above Equation 2, and determines the positive electrode and negative electrode available ranges $p_f \sim p_i$ and $n_f \sim n_i$ changed at MOL based on the calculated $p_i$, $n_f$.

Subsequently, the profile management module 152 generates a differential profile corresponding to a difference between BOL positive electrode half-cell SOC-OCV profile part and BOL negative electrode half-cell SOC-OCV profile part corresponding to the determined changed positive electrode and negative electrode available range, and estimates the generated differential profile as a full-cell SOC-OCV profile at MOL (see FIG. 5) (S50).

Preferably, before generating the differential profile, the available range determination module 151 may shift to the left or right, the negative electrode half-cell SOC-OCV profile part corresponding to the changed negative electrode available range and/or the positive electrode half-cell SOC-OCV profile part corresponding to the changed positive electrode available range to cause the capacity ranges (i.e., X-axis ranges) of the two available ranges to overlap, so that the minimum allowable SOC value $n_i$ of the changed negative electrode available range and the minimum allowable SOC value $p_i$ of the positive electrode available range are equal to each other, or the maximum allowable SOC value $n_f$ of the changed negative electrode available range and the maximum allowable SOC value $p_f$ of the positive electrode available range are equal to each other.

The profile management module 152 checks the capacity range of the full-cell in the MOL full-cell SOC-OCV profile from the differential profile, and re-sets the maximum allowable SOC value corresponding to the left end point of the profile to '1' and the minimum allowable SOC value corresponding to the right end point of the profile to '0'. Additionally, the profile management module 152 updates the existing full-cell SOC-OCV profile stored in the storage unit 130 to the estimated MOL full-cell SOC-OCV profile (S60). For example, when the existing full-cell SOC-OCV profile is recorded in the storage unit 130 in the form of a lookup table, the profile management module 152 re-sets the SOC value allocated to each OCV value using the updated MOL full-cell SOC-OCV profile.

Meanwhile, the available range determination module 151 of the control unit 150 may monitor if the next profile update cycle arrives, and when the profile update cycle arrives, the process subsequent to S10 may be repeated again.

There is an attempt to charge and discharge a lithium secondary battery in 3 cycles, wherein the lithium secondary battery includes a positive electrode material of NCM (nickel, cobalt, manganese) and a negative electrode material of graphite, and having the specification of the BOL full-cell total capacity $Q_{f,0}$ corresponding to 50.6496 Ah, the available voltage range of 4.2~2.5V and the available current range of 0~150 A. In the BOL positive electrode half-cell SOC-OCV profile of the lithium secondary battery used in the experiment, the total capacity $Q_{+,0}$ of the BOL positive electrode half-cell is 54.7831 Ah, $p_{f,0}$ is 1 and $p_{i,0}$ is 0.075451, and the profile has a profile shape shown in FIG. 2. Additionally, in the BOL negative electrode half-cell SOC-OCV profile of the lithium secondary battery used in the experiment, the total capacity $Q_{-,0}$ of the BOL negative electrode half-cell is 63.7795 Ah, $n_{f,0}$ is 0.79971 and $n_{i,0}$ is 0.0055728, and the profile has a profile shape shown in FIG. 2.

Meanwhile, the MOL full-cell total capacity $Q_f$ of the lithium secondary battery charged and discharged in 400 cycles is measured as 46.237 Ah.

When the factors $p_{f,0}$, $p_{i,0}$, $Q_{f,0}$, $n_{i,0}$, $n_{f,0}$ and the MOL full-cell total capacity $Q_f$ that can be obtained from the BOL positive electrode half-cell SOC-OCV profile and the BOL negative electrode half-cell SOC-OCV profile of the lithium secondary battery are substituted into Equation 2, $p_i$ is calculated as 0.155997 and $n_f$ is calculated as 0.730524. Accordingly, the MOL positive electrode available range is determined as the range of $p_f$-$p_i$ in the BOL positive electrode half-cell SOC-OCV profile, and the MOL negative electrode available range is determined as the range of $n_f$-$n_i$ in the BOL negative electrode half-cell SOC-OCV profile. The differential profile generated from a difference between the BOL positive electrode SOC-OCV profile part corresponding to the MOL positive electrode available range and the BOL negative electrode SOC-OCV profile part corresponding to the determined MOL negative electrode available range is estimated in the form of the MOL full-cell SOC-OCV profile shown in FIG. 5.

In the lithium secondary battery, the MOL full-cell SOC-OCV profile obtained through the actual charge/discharge experiment corresponding to 400 cycles substantially matches the estimated MOL full-cell SOC-OCV profile. That is, the lithium secondary battery is charged and discharged repeatedly several times as much as 400 cycles, SOC data at the time of measuring each OCV is collected, an MOL full-cell SOC-OCV profile indicating a correlation between OCV and SOC is generated based on the collected data, and the generated MOL full-cell SOC-OCV profile and the MOL full-cell SOC-OCV profile estimated according to the present disclosure are compared, and as a result of the comparison, the two profiles substantially match.

Meanwhile, at least one of the control logics illustrated in FIG. 6 may be combined, and the combined control logics may be written in computer-readable coding systems and stored in computer-readable recording media. The recording media is not limited to a particular type and includes any type that can be accessed by the processor included in the computer. For example, the recording media may include at least one selected from the group consisting of ROM, RAM, register, CD-ROM, magnetic tape, hard disk, floppy disk and an optical data recording device. Additionally, the coding systems may be modulated to a carrier signal and included in a communication carrier at a specific point in time, and may be stored and executed in computers connected via a network in distributed manner. Additionally, functional programs, codes and segments for implementing the combined control logics may be easily inferred by programs in the technical field pertaining to the present disclosure.

The apparatus 100 for estimating an SOC-OCV profile according to the present disclosure may be included as part of a system called a Battery Management System (BMS). Additionally, the BMS may be mounted in various types of electrically operated devices that can operate using electrical energy supplied from the secondary battery 200.

According to an aspect, the electrically operated device may be a mobile phone, a laptop computer, a mobile computer device including a tablet computer, or a handheld multimedia device including a digital camera, a video camera and an audio/video player device.

According to another aspect, the electrically operated device may be an electricity powered device that can move by electricity such as an electric vehicle, a hybrid electric vehicle, an electric bike, an electric motorcycle, an electric locomotive, an electric ship and an electric aircraft, or a power tool including a motor such as an electric drill and an electric grinder.

According to still another aspect, the electrically operated device may be a large capacity power storage system installed in a power grid to store renewable energy or redundant power, or an uninterruptible power system to supply power to various types of information communication devices including a server computer or a mobile communication device in an emergent situation such as blackout.

In describing various embodiments of the present disclosure, the components designated by 'unit' or 'module' should be understood as elements which are classified functionally rather than physically. Accordingly, each component may be selectively combined with other component, or may be divided into subcomponents for efficient execution of control logic(s). However, it is obvious to those skilled in the art that even though the components are combined or divided, if the sameness of functions can be acknowledged, the combined or divided components should be construed as being in the scope of the present disclosure.

While the present disclosure has been hereinabove described with regard to a limited number of embodiments and drawings, the present disclosure is not limited thereto and it should be understood that various modifications and changes may be made by those skilled in the art within the technical aspects of the present disclosure and the equivalent scope of the appended claims.

What is claimed is:

1. An apparatus for estimating a state of charge (SOC)-open circuit voltage (OCV) profile, comprising:
   a storage unit configured to store:
      a beginning of life (BOL) positive electrode half-cell SOC-OCV profile;

a BOL positive electrode available range between a lowest available SOC and a highest available SOC for a positive electrode of a secondary battery;
a BOL negative electrode half-cell SOC-OCV profile;
a BOL negative electrode available range between a lowest available SOC and a highest available SOC for a negative electrode of the secondary battery;
a BOL full-cell SOC-OCV profile; and
a BOL full-cell total capacity;
a control unit configured to estimate a full-cell SOC-OCV profile at middle of life (MOL), the control unit including:
an available range determination module configured to:
calculate an MOL full-cell total capacity after a secondary battery is fully charged and then fully discharged, between a lower limit of discharge voltage and an upper limit of charge voltage when the secondary battery is at MOL, based on a current of the secondary battery sensed by a sensor after the secondary battery is fully charged and then fully discharged; and
determine the MOL positive electrode available range by using the highest available SOC in the BOL positive electrode available range as a highest available SOC in the MOL positive electrode available range, and determine the MOL negative electrode available range by using the lowest available SOC in the BOL negative electrode available range as a lowest available SOC in the MOL negative electrode available range, such that:
a ratio of the MOL full-cell total capacity to the BOL full-cell total capacity is equal to each of a ratio of the MOL positive electrode available range to the BOL positive electrode available range and a ratio of the MOL negative electrode available range to the BOL negative electrode available range;
a lowest available SOC for the MOL positive electrode available range is higher than the lowest available SOC for the positive electrode of the secondary battery at BOL; and
a highest available SOC for the MOL negative electrode available range is lower than the highest available SOC for the negative electrode of the secondary battery at BOL; and
a profile management module configured to:
estimate, as the MOL full-cell SOC-OCV profile, a differential profile corresponding to a difference between:
a portion of the BOL positive electrode half-cell SOC-OCV profile corresponding to the MOL positive electrode available range; and
a portion of the negative electrode half-cell SOC-OCV profile corresponding to the MOL negative electrode available range; and
update the BOL full-cell SOC-OCV profile stored in the storage unit to be the estimated MOL full-cell SOC-OCV profile; and
a communication unit configured to communicate, under control of the control unit, with an external device to transmit the estimated MOL full-cell SOC-OCV profile, stored in the storage unit, to the external device to control charging and discharging of the secondary battery.

2. The apparatus for estimating an SOC-OCV profile according to claim 1, wherein the available range determination module is further configured to:
determine the MOL positive electrode available range and the MOL negative electrode available range by calculating a lowest allowable SOC value ($p_i$) in the BOL positive electrode half-cell SOC-OCV profile at MOL as the lowest available SOC in the MOL positive electrode available range and a highest allowable SOC value ($n_f$) in the BOL negative electrode half-cell SOC-OCV profile at MOL as the highest available SOC in the MOL negative electrode available range, using the following Equation:

$$p_i = p_{f,0} - \frac{(p_{f,0} - p_{i,0})Q_f}{Q_{f,0}}$$

$$n_f = n_{i,0} + \frac{(n_{f,0} - n_{i,0})Q_f}{Q_{f,0}},$$

(Equation)

where:
$p_{f,0}$ is the highest allowable SOC value of the positive electrode half-cell at BOL,
$p_{i,0}$ is the lowest allowable SOC value of the positive electrode half-cell at BOL,
$n_{f,0}$ is the highest allowable SOC value of the negative electrode half-cell at BOL,
$n_{i,0}$ is the lowest allowable SOC value of the negative electrode half-cell at BOL,
$Q_{f,0}$ is the total capacity of the full-cell at BOL, and
$Q_f$ is the total capacity of the full-cell at MOL.

3. The apparatus for estimating an SOC-OCV profile according to claim 2, wherein the available range determination module is further configured to:
calculate an integrated current amount by accumulating and integrating a current of a secondary battery while the secondary battery is fully charged or fully discharged between the lower limit of discharge voltage and the upper limit of charge voltage; and
determine the calculated integrated current amount as the MOL full-cell total capacity.

4. The apparatus for estimating an SOC-OCV profile according to claim 1, wherein the available range determination module is further configured to:
shift the portion of the BOL positive electrode half-cell SOC-OCV profile corresponding to the MOL positive electrode available range and the portion of the BOL negative electrode half-cell SOC-OCV profile corresponding to the MOL negative electrode available range relative to each other so that the lowest available SOC of the MOL negative electrode available range and the lowest available SOC of the MOL positive electrode available range are equal to each other; and
determine a differential profile of the two profiles shifted relative to each other as the estimated MOL full-cell SOC-OCV profile.

5. The apparatus for estimating an SOC-OCV profile according to claim 1, wherein the secondary battery is a lithium secondary battery including:
a Ni—Mn—Co based positive electrode material in a positive electrode; and
graphite in a negative electrode.

6. A battery management system comprising the apparatus for estimating an SOC-OCV profile according to claim 1.

7. The apparatus for estimating an SOC-OCV profile according to claim 1, wherein the control unit is configured to estimate the full-cell SOC-OCV profile at MOL and to replace the BOL full-cell SOC-OCV profile stored in the storage unit with the estimated MOL full-cell SOC-OCV profile only after the secondary battery has gone through a predetermined number of charge and discharge cycles or a predetermined total amount of charge and discharge times.

8. A method for estimating a state of charge (SOC)-open circuit voltage (OCV) profile reflecting a degradation rate of a secondary battery, the method comprising:
storing:
a beginning of life (BOL) positive electrode half-cell SOC-OCV profile;
a BOL positive electrode available range between a lowest available SOC and a highest available SOC for a positive electrode;
a BOL negative electrode half-cell SOC-OCV profile;
a BOL negative electrode available range between a lowest available SOC and a highest available SOC for a negative electrode;
a BOL full-cell SOC-OCV profile; and
a BOL full-cell total capacity;
calculating a middle of life (MOL) full-cell total capacity after the secondary battery is fully charged and then fully discharged, between a lower limit of discharge voltage and an upper limit of charge voltage when the secondary battery is at MOL, based on a current of the secondary battery sensed by a sensor after the secondary battery is fully charged and then fully discharged;
determining the MOL positive electrode available range by using the highest available SOC in the BOL positive electrode available range as a highest available SOC in the MOL positive electrode available range, and the MOL negative electrode available range by using the lowest available SOC in the BOL negative electrode available range as a lowest available SOC in the MOL negative electrode available range, such that:
a ratio of the MOL full-cell total capacity to the BOL full-cell total capacity is equal to each of a ratio of the MOL positive electrode available range to the BOL positive electrode available range and a ratio of the MOL negative electrode available range to the BOL negative electrode available range;
a lowest available SOC for the MOL positive electrode available range is higher than the lowest available SOC for the positive electrode of the secondary battery at BOL; and
a highest available SOC for the MOL negative electrode available range is lower than the highest available SOC for the negative electrode of the secondary battery at BOL;
estimating, as an MOL full-cell SOC-OCV profile, a differential profile corresponding to a difference between:
a portion of the BOL positive electrode half-cell SOC-OCV profile corresponding to the determined MOL positive electrode available range; and
a portion of the BOL negative electrode half-cell SOC-OCV profile corresponding to the determined MOL negative electrode available range;
updating a previously stored BOL full-cell SOC-OCV profile to be the estimated MOL full-cell SOC-OCV profile; and
communicating with an external device to transmit the estimated MOL full-cell SOC-OCV profile to the external device to control charging and discharging of the secondary battery.

9. The method for estimating an SOC-OCV profile according to claim 8, wherein the determining comprises:
determining the MOL positive electrode available range and the MOL negative electrode available range by calculating a lowest allowable SOC value ($p_i$) in the BOL positive electrode half-cell SOC-OCV profile at MOL as the lowest available SOC in the MOL positive electrode available range and a highest allowable SOC value ($n_f$) in the BOL negative electrode half-cell SOC-OCV profile at MOL as the highest available SOC in the MOL negative electrode available range, using the following Equation:

$$p_i = p_{f,0} - \frac{(p_{f,0} - p_{i,0})Q_f}{Q_{f,0}} \quad \text{(Equation)}$$

$$n_f = n_{i,0} + \frac{(n_{f,0} - n_{i,0})Q_f}{Q_{f,0}},$$

where:
$p_{f,0}$ is the highest allowable SOC value of the positive electrode half-cell at BOL,
$p_{i,0}$ is the lowest allowable SOC value of the positive electrode half-cell at BOL,
$n_{f,0}$ is the highest allowable SOC value of the negative electrode half-cell at BOL,
$n_{i,0}$ is the lowest allowable SOC value of the negative electrode half-cell at BOL,
$Q_{f,0}$ is the total capacity of the full-cell at BOL, and
$Q_f$ is the total capacity of the full-cell at MOL.

10. The method for estimating an SOC-OCV profile according to claim 9, wherein the calculating the MOL full-cell total capacity comprises:
calculating an integrated current amount by accumulating and integrating a current of the secondary battery while the secondary battery is fully charged or fully discharged between the lower limit of discharge voltage and the upper limit of charge voltage; and
determining the calculated integrated current amount as the MOL full-cell total capacity.

11. The method for estimating an SOC-OCV profile according to claim 8, further comprising shifting the portion of the BOL positive electrode half-cell SOC-OCV profile corresponding to the MOL positive electrode available range and the portion of the BOL negative electrode half-cell SOC-OCV profile corresponding to the MOL negative electrode available range relative to each other so that the lowest available SOC of the MOL negative electrode available range and the lowest available SOC of the MOL positive electrode available range are equal to each other.

12. A computer-readable recording medium having recorded thereon a program for performing the method for estimating an SOC-OCV profile according to claim 8.

13. The method for estimating an SOC-OCV profile according to claim 8, further comprising:
determining whether a preset condition for updating the stored full-cell SOC-OCV profile is met,
wherein the calculating, the determining, the estimating, and the updating are performed if the preset condition is determined to be met.

14. The method for estimating an SOC-OCV profile according to claim 13, wherein the present condition is a predetermined number of charge and discharge cycles or a predetermined total amount of charge and discharge times that the secondary battery has gone through.

* * * * *